(12) United States Patent
Lee et al.

(10) Patent No.: US 8,013,445 B2
(45) Date of Patent: Sep. 6, 2011

(54) LOW RESISTANCE HIGH RELIABILITY CONTACT VIA AND METAL LINE STRUCTURE FOR SEMICONDUCTOR DEVICE

(75) Inventors: Hsiang-Huan Lee, Jhudong Township, Hsinchu County (TW); Ming Han Lee, Taipei (TW); Ming-Shih Yeh, Chupei (TW); Chen-Hua Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 482 days.

(21) Appl. No.: 12/112,405

(22) Filed: Apr. 30, 2008

(65) Prior Publication Data
US 2009/0218693 A1 Sep. 3, 2009

Related U.S. Application Data

(60) Provisional application No. 61/067,698, filed on Feb. 29, 2008.

(51) Int. Cl.
*H01L 23/48* (2006.01)
*H01L 21/4763* (2006.01)

(52) U.S. Cl. .................. 257/751; 257/E21.49; 438/643
(58) Field of Classification Search .................. 438/643; 257/751
See application file for complete search history.

(56) References Cited

U.S. PATENT DOCUMENTS 7,507,659 B2 * 3/2009 Ohtsuka et al. ............... 438/643
2007/0048931 A1 3/2007 Shimizu et al.

* cited by examiner

*Primary Examiner* — W. David Coleman
(74) *Attorney, Agent, or Firm* — Duane Morris LLP

(57) ABSTRACT

A semiconductor contact structure includes a copper plug formed within a dual damascene, single damascene or other opening formed in a dielectric material and includes a composite barrier layer between the copper plug and the sidewalls and bottom of the opening. The composite barrier layer preferably includes an ALD TaN layer disposed on the bottom and along the sides of the opening although other suitable ALD layers may be used. A barrier material is disposed between the copper plug and the ALD layer. The barrier layer may be a Mn-based barrier layer, a Cr-based barrier layer, a V-based barrier layer, a Nb-based barrier layer, a Ti-based barrier layer, or other suitable barrier layers.

20 Claims, 4 Drawing Sheets

LOW RESISTANCE HIGH RELIABILITY CONTACT VIA AND METAL LINE STRUCTURE FOR SEMICONDUCTOR DEVICE

RELATED APPLICATIONS

This application is related to and claims priority of U.S. Provisional Application Ser. No. 61/067,698 entitled LOW RESISTANCE HIGH RELIABILITY CONTACT VIA AND METAL LINE STRUCTURE FOR SEMICONDUCTOR DEVICE, filed Feb. 29, 2008, the contents of which are incorporated by reference as if set forth in their entirety.

FIELD OF THE INVENTION

The present invention relates, most generally, to semiconductor devices and methods for forming the same. More particularly, the present invention relates to a conductive structure formed in a semiconductor device.

BACKGROUND

In today's rapidly advancing semiconductor manufacturing industry, the integrated circuit chips that form semiconductor devices include a multitude of conductive structures such as interconnect lines, contacts and vias. The performance of a semiconductor device depends upon device speed and there is an aggressive, continuing push to increase device speed and enhance device performance. The speed of a device is directly proportional and highly dependent upon the contacts and vias, collectively referred to as contact structures, formed between interconnection structures and the various semiconductor components and substructures. As such, various materials and combinations of materials have been used in an attempt to provide low-resistance contact structures and low-resistance interconnect structures. Moreover, as technologies advance, device features become smaller and smaller and the aspect ratios of the openings within which contacts, vias and other conductive structures are formed, becomes higher. This makes it more difficult to completely fill the contact or via openings in a void-free manner necessary to produce a suitably low contact or via resistance, using conventional technology. The reliability of a semiconductor device is also extremely critical and reliability can be degraded or compromised by poor contact i.e. high contact resistance.

A conventional structure commonly used as a contact between a metal layer and a further semiconductor device or used as a via between metal layers, is a tungsten plug with one or more barrier layers and other layers. Conventional contact structures are commonly formed by forming an opening in a dielectric layer, then forming a PVD, physical vapor deposition, barrier layer with an additional glue layer lining the opening prior to filling the opening with CVD tungsten, i.e. tungsten formed using a chemical vapor deposition, CVD, process. Barrier layers are utilized extensively in semiconductor device processing. Barrier layers are used at contact junctions between metal materials to prevent spiking between the metal materials. As the aspect ratio of single or dual damascene contact and via structures increases, it becomes increasingly difficult to obtain good step coverage using conventional PVD and CVD methods. The poor step coverage results in voids that increase the resistivity of the contact structure and degrade device performance. Additionally, as the size of the contact continues to decrease, the resistivity of the tungsten contact increases dramatically slowing down the semiconductor device and thereby degrading performance. As such, copper has been considered as a replacement for tungsten in contact and via structures but copper conventionally requires the initial formation of a PVD barrier layer followed by a seed layer formed in the opening before copper deposition takes place. As above, the shortcomings of forming a barrier layer using PVD processes include poor step coverage and an associated increase in resistance and a decrease in reliability.

It would therefore be desirable to produce conductive structures such as contacts, vias and conductive lines, with lows resistance and high reliability and which are scalable to the reduced geometries and high aspect ratios required in today's semiconductor manufacturing industry.

SUMMARY OF THE INVENTION

One aspect of the invention provides a method for forming a semiconductor device. The method comprises using an atomic layer deposition (ALD) method to deposit a ALD layer along sidewalls and covering a bottom surface of an opening extending though a dielectric layer, forming an Mn-based barrier layer on the ALD layer and depositing copper in the opening such that the copper contacts the Mn-based barrier layer and fills the opening, thereby forming a semiconductor conductive structure.

According to another aspect, provided is a method for forming a semiconductor device. The method comprises using an atomic layer deposition (ALD) method to deposit a TaN layer along sidewalls and covering a bottom surface of an opening extending though a dielectric layer, forming a barrier layer on the TaN layer and depositing copper in the opening such that the copper contacts the barrier layer and fills the opening, thereby forming a semiconductor conductive structure. The barrier layer may be a Cr-based barrier layer, a V-based barrier layer, a Nb-based barrier layer, a Ti-based barrier layer, or other suitable barrier layers.

According to another aspect, provided is a conductive semiconductor device. The device includes a conductive structure disposed within a dielectric. The conductive structure comprises a composite barrier layer lining an opening formed in the dielectric. The composite barrier layer includes a TaN or other layer along sidewalls and the bottom of the opening and an Mn-based layer along the TaN or other layer. Copper fills the opening and bounds the Mn-based layer. The TaN or other layer includes a thickness of about 2-100 angstroms. According to another aspect, the conductive structure may include the TaN or other layer being a conformal layer formed using atomic layer deposition and having various thicknesses. The TaN or other layer may be formed of TiN, WN, Co, CoN or other suitable materials, in other exemplary embodiments.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Aspects of the invention include a semiconductor conductive structure. The conductive structure may be a contact i.e. a conductive structure that provides contact between a metal line and a semiconductor structure. In other embodiments, the conductive structure may be a via, i.e. a conductive structure that provides contact between metal layers disposed at different topographical locations, and in other exemplary embodiments, the conductive structure may be a metal lead line that travels laterally and which may contact other subjacent metal lines or semiconductor devices and/or superjacent metal lines. The following illustrated embodiments are intended to be exemplary only as the illustrated methods and structures of the invention may be used in other applications. In other words, the structure of a conductive structure illustrated as a contact over a semiconductor material may also be used as a via over a metal maternal and vice versa.

Figure 1A:
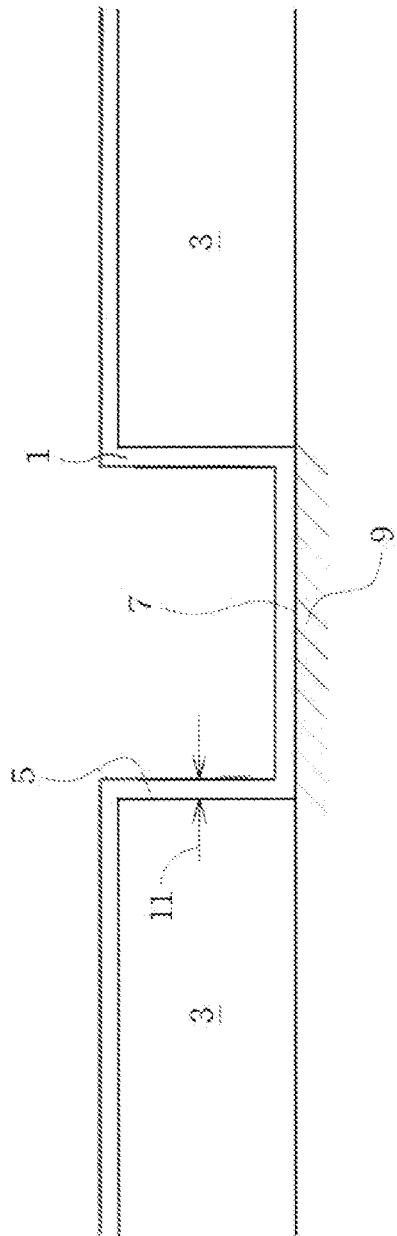
FIGS. 1A and 1B are cross-sectional views illustrating a sequence of processing operations used to produce the exemplary semiconductor structure shown in FIG. 1B.

Now turning to the figures, FIG. 1A shows ALD layer 1 formed over dielectric layer 3 and within an opening in dielectric layer 3. The opening is defined by sidewalls 5 and a bottom 7. The opening extends through dielectric layer 3 and contacts subjacent material 9. In other exemplary embodiments, the bottom of the opening may lie within dielectric layer 3. Subjacent material 9 may be a semiconductor material implanted with one or more dopant impurities in one exemplary embodiment but subjacent material 9 may be any of various other materials or further structures such as a metal surface or a surface of another semiconductor structure, in other exemplary embodiments. Dielectric layer 3 may be any of various suitable dielectric materials used in the semiconductor manufacturing industry. Dielectric layer 3 may be an oxide, an oxynitride, a low-k dielectric, a high-k dielectric or other dielectric materials and dielectric layer 3 may advantageously be a dielectric chosen in conjunction with the conductive material that will be used to substantially fill the opening formed within dielectric layer 3. Dielectric layer 3 may represent a stack of dielectric films in various exemplary embodiments.

ALD layer 1 is formed using atomic layer deposition (ALD), a gas phase chemical process used to create extremely thin films. Various ALD techniques may be used. ALD is a self-limiting sequential surface chemistry that deposits conformal thin film materials onto substrates of various compositions. ALD reactions typically use precursor materials and by keeping the precursor material separate throughout the deposition process atomic scale deposition control is achievable. The conformal ALD film provides excellent step coverage regardless of the topography over which the ALD film is formed and, hence, regardless of the aspect ratio of the opening within which the ALD firm is formed. The atomic scale deposition control results in ALD layer 1 being a conformal film formed to a thickness 11 that may range from 2-100 angstroms in one exemplary embodiment but other thicknesses may be achieved in other exemplary embodiments. The ratio of ALD layer 1 thickness 11 along sidewalls 5 to ALD layer 1 thickness 11 along bottom 7 may be from 0.6:1 to 1.8:1 in an exemplary embodiment but other ratios may be achieved in other exemplary embodiments. ALD layer 1 may be TaN in one exemplary embodiment but other suitable Cu barrier materials such as TiN, WN, Co, CoN and the like may be used in other exemplary embodiments. ALD layer 1 may be amorphous or polycrystalline in nature and it may include suitable additives such as but not limited to, C, O or F.

Figure 1B:
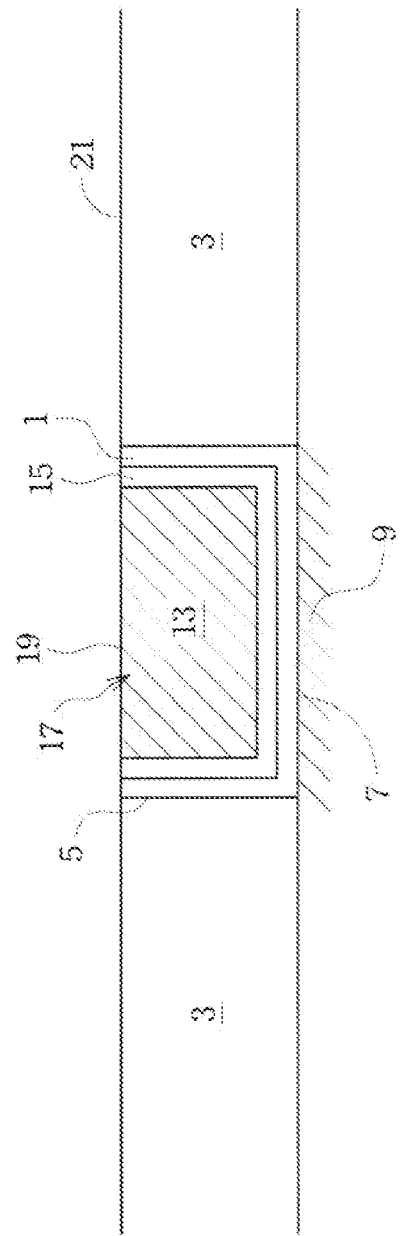

FIG. 1B shows the structure of FIG. 1A after a sequence of subsequent processing operations have been carried out upon the structure. Barrier film 15 is formed on ALD layer 1 and within the opening formed in dielectric layer 3. Barrier film 15 may be a Mn-containing, or Mn-based layer such as formed of Mn, $MnO_x$, $MnC_x$, $MnSi_xO_y$, $MnN_x$ or various combinations thereof. In other exemplary embodiments, barrier film 15 may be a Cr-based layer, a V-based layer, a Nb-based layer, a Ti-based layer or suitable various combinations thereof. As with the Mn embodiment, the Cr, V, Nb, or Ti-based layer may be substantially an elemental film or it may be various suitable compounds. In various exemplary embodiments, the Cr-based barrier layer may be at least one of $CrO_x$, $CrC_x$, $CrSiC_xO_y$, and $CrN_x$; the V-based barrier layer may be at least one of $VO_x$, $VC_x$, $VSi_xO_y$, and $VN_x$; the Nb-based barrier layer may be at least one of $NbO_x$, $NbC_x$, $NbSi_xO_y$, and $NbN_x$; and the Ti-based barrier layer may be at least one of $TiO_x$, $TiC_x$, $TiSi_xO_y$, and $TiN_x$, but in each case, other suitable compounds may be used in other exemplary embodiments.

Conventional methods such as PVD, physical vapor deposition, or CVD, chemical vapor deposition, may be used to form barrier film 15. Barrier film 15 improved adhesion between ALD layer 1 and a subsequently formed conductive material and thus improves electromigration performance. After the formation of barrier film 15, the opening is preferably filled with copper 13 and the structure may then be planarized or polished using chemical mechanical polishing, CMP, or other polishing operations to form conductive structure 17 having a surface 19 being coplanar with top surface 21 of dielectric layer 3. Copper 13 may be formed using ECP, electrochemical plating, or other suitable deposition techniques. A metal or other film may be formed over conductive structure 17 although not illustrated in FIG. 1B and in this manner, conductive structure 17 provides electrical contact between a conductive or semiconductive material formed thereover and a conductive or semiconductive material formed thereunder, i.e. subjacent material 9.

Figure 2:
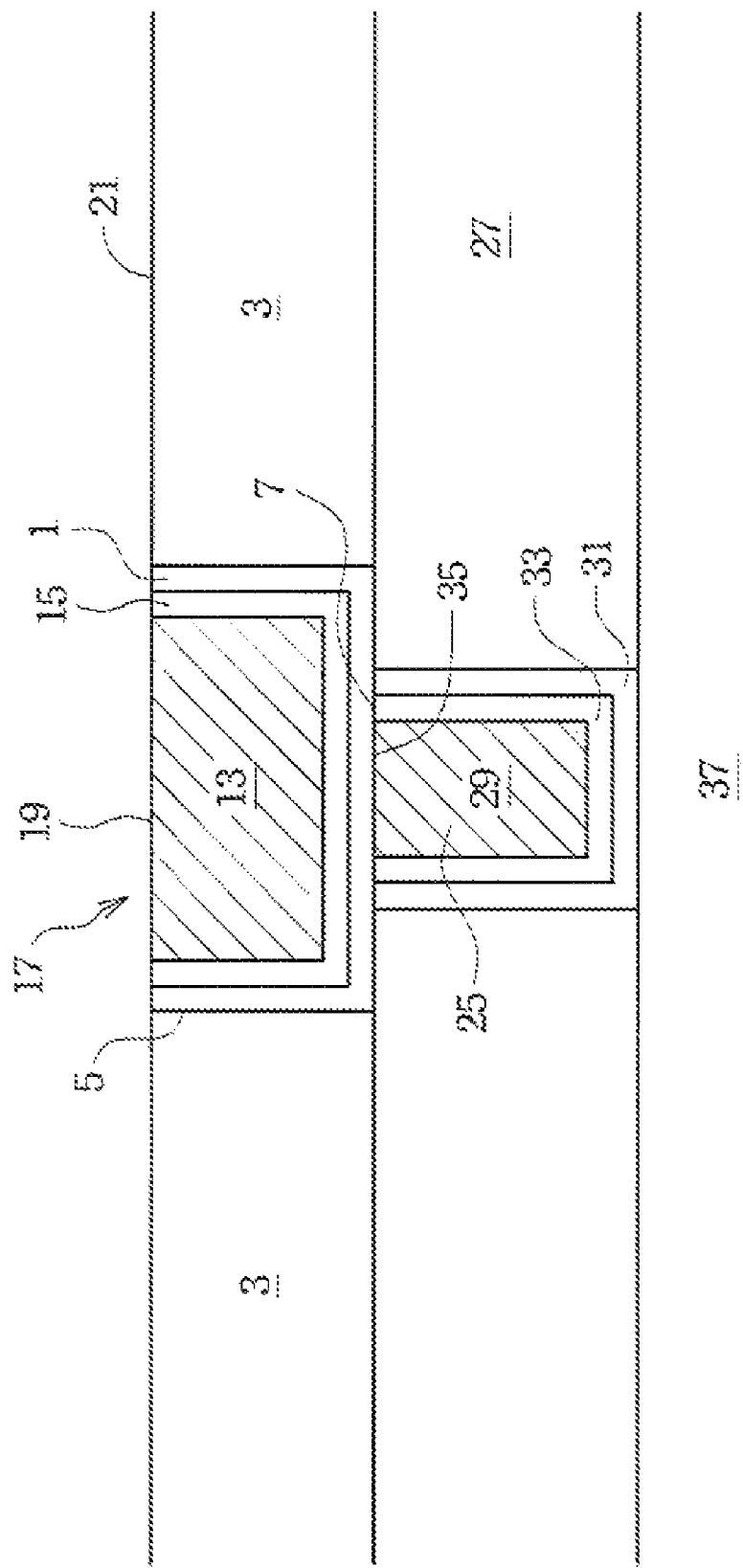
FIG. 2 is a cross-sectional view showing another exemplary structure according to the invention.

FIG. 2 is a cross-sectional view showing conductive structure 17, described in conjunction with FIG. 1B, disposed over conductive structure 25. Conductive structure 25 is formed within dielectric layer 27 and over substrate 37 and includes films 31 and 33 and conductive material 29. According to one exemplary embodiment, conductive structure 25 may be substantially similar to conductive structure 17, i.e. film 31 may be an ALD layer, film 33 may be a barrier layer such as an Mn-based layer, conductive material 29 may be copper and substrate 37 may be subjacent material 9 such as described in conjunction with FIG. 1B. According to this illustrated embodiment, bottom 7 of conductive structure 17 contacts metal surface 35 of conductive structure 25.

Figure 3:
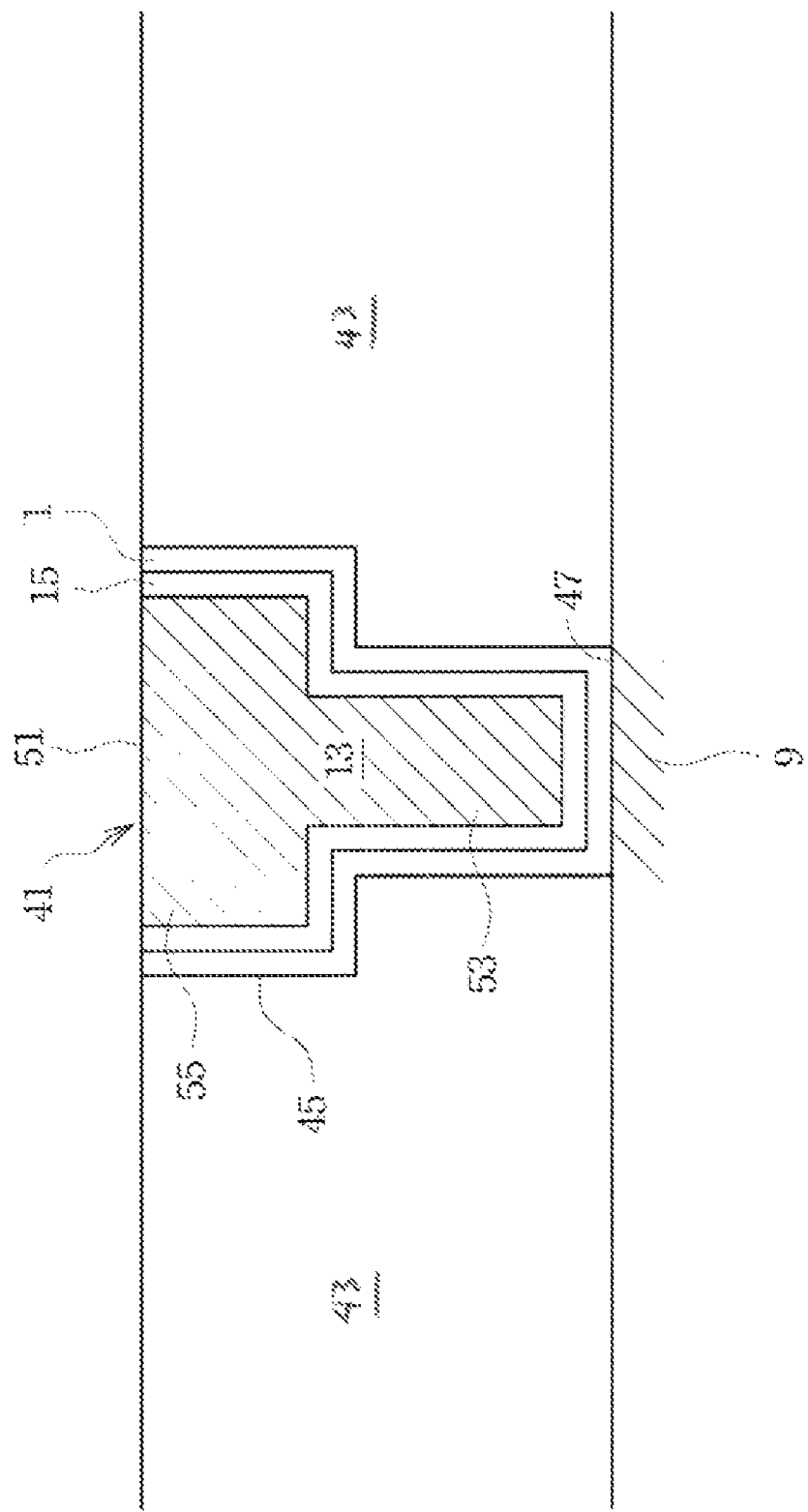
FIG. 3 is a cross-sectional view of yet another exemplary structure of the invention.

FIG. 3 shows a conductive structure formed in a dual damascene opening according to another aspect of the invention. Conductive structure 41 is formed within a dual damascene opening defined by sidewalls 45 and bottom 47, the opening extending through dielectric layer 43. Dielectric layer 43 may be formed of any of various suitable dielectric materials and the dual damascene opening may be formed using various conventional techniques and an etch-stop layer (not illustrated) may optionally be included at the juncture between the upper and lower portions of the dual damascene opening. Conformal ALD layer 1, barrier film 15 and copper 13 are as described previously and planarized surface 51 may be formed using various polishing and planarizing techniques.

Still referring to FIG. 3, copper 13 may include a lower portion 53 that serves as a contact structure in a contact portion of the dual damascene opening, and an upper portion 55 that may be a metal interconnect lead formed in the upper trench portion of the dual damascene opening. A barrier free structure is then produced between the copper contact structure, and the copper first metal interconnect structure.

Figure 4:
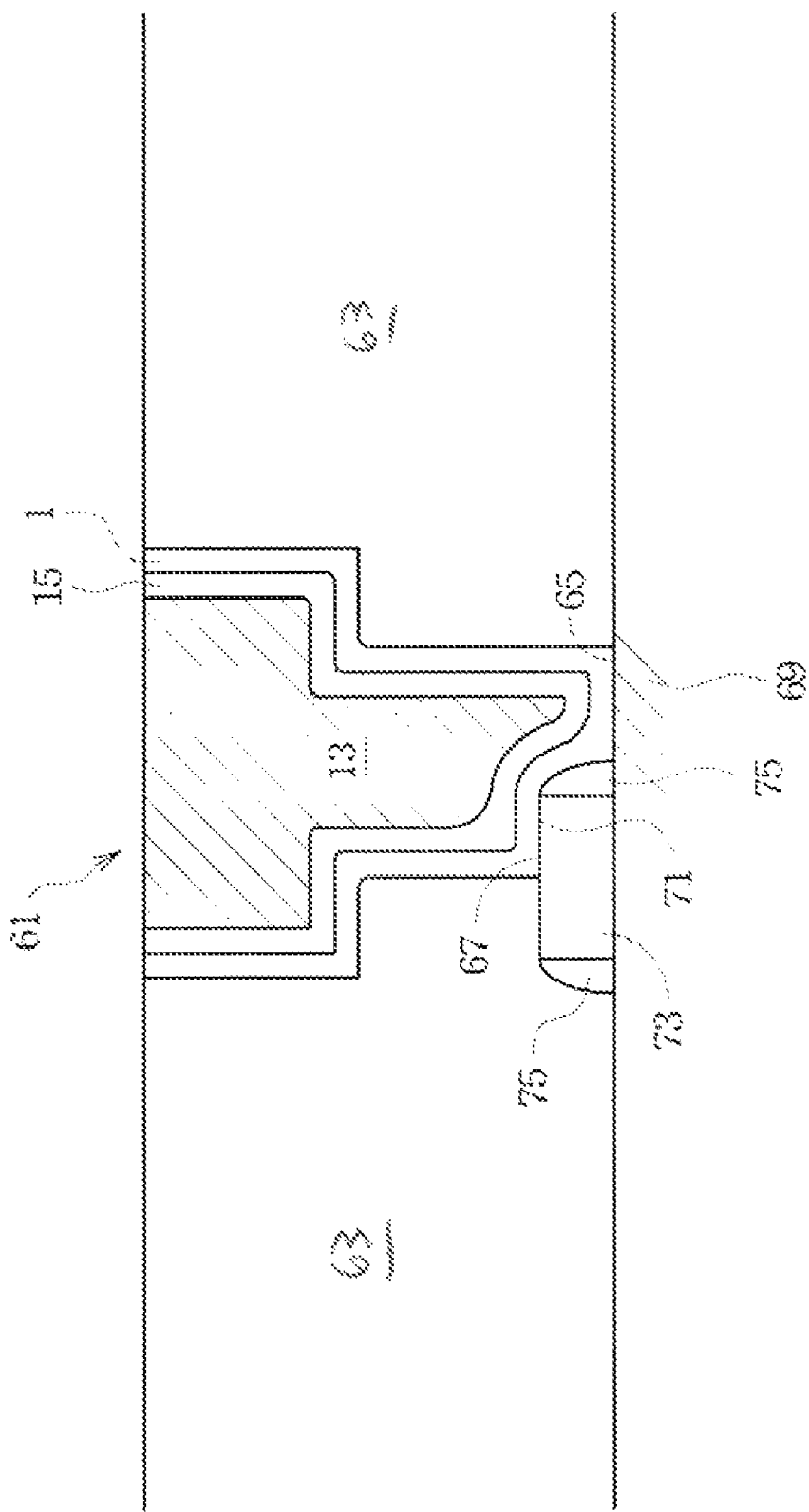
FIG. 4 is a cross-sectional view showing still another exemplary structure according to the invention.

FIG. 4 shows conductive structure 61 formed in a generally dual damascene opening formed in dielectric layer 63. The bottom of conductive structure 61 includes lower bottom portion 65 and raised bottom portion 67. Lower bottom portion 65 contacts subjacent material 69 which may be a semiconductor material that includes dopant impurities therein, such as introduced using ion implantation or other suitable diffusion techniques. Raised bottom portion 67 contacts top surface 71 of contact structure 73. In one exemplary embodiment, contact structure 73 may be a polycide gate of a transistor and the polycide gate may include optional spacers 75 but in other exemplary embodiments, contact structure 73 may be various other structures formed over a substrate such as subjacent material 69, and to which contact is being made.

While the described exemplary conductive structures may advantageously be contact or via structures, according to various exemplary embodiments, the cross-sectional representations of the conductive structures may represent a latitudinal or other cross-section of a metal interconnect lead line.

The preceding merely illustrates the principles of the invention. It will thus be appreciated that those skilled in the art will be able to devise various arrangements which, although not explicitly described or shown herein, embody the principles of the invention and are included within its spirit and scope.

For example, the various different conductive structures that represent the exemplary illustrated embodiments of the invention such as contact and vias formed in damascene or dual damascene openings may be used interchangeably. Moreover, the variously configured conductive structures may provide contact between various superjacent features and various subjacent features such as the multiple subjacent contact regions such as illustrated in FIG. 4.

Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e. any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the invention includes other variants and embodiments which may be made by those skilled in the art without departing from the scope and range of equivalents of the invention.

What is claimed is:

1. A method for forming a semiconductor device, said method comprising:
    using an atomic layer deposition (ALD) method to deposit an ALD layer along sidewalls and covering a bottom surface of an opening extending through a dielectric layer;
    forming an Mn-based barrier layer directly on and contacting said ALD layer; and
    depositing Cu in said opening such that said Cu contacts said Mn-based barrier layer and substantially fills said opening, thereby forming a conductive structure in said opening.

2. The method as in claim 1, wherein said ALD layer comprises TaN.

3. The method as in claim 1, wherein said ALD layer is polycrystalline and includes a thickness within a range of about 2-100 angstroms.

4. The method as in claim 1, wherein said Mn-based barrier layer comprises Mn.

5. The method as in claim 1, wherein said Mn-based barrier layer comprises at least one of $MnO_x$, $MnN_x$, $MnC_x$ and $MnSi_xO_y$.

6. The method as in claim 1, wherein said ALD layer comprises a layer of at least one of TiN, WN, Co, and CoN.

7. The method as in claim 1, wherein said bottom surface includes a lowermost portion and a raised portion at a higher location than said lowermost portion, said lowermost portion comprising a subjacent layer of semiconductor material with dopant impurities therein and said raised portion comprising at least part of a subjacent gate structure formed over said subjacent layer.

8. The method as in claim 1, wherein said opening comprises a trench, said conductive structure comprises a conductive lead and said depositing Cu comprises electrochemical plating.

9. The method as in claim 1, wherein said ALD layer is a polycrystalline layer conformally deposited directly on said sidewalls and said bottom surface.

10. The method as in claim 1, wherein said opening comprises a dual damascene opening and said bottom surface comprises a metal surface.

11. A method for forming a semiconductor device, said method comprising:
    using an atomic layer deposition (ALD) method to deposit a TaN layer along sidewalls and covering a bottom surface of an opening extending through a dielectric layer;
    forming a barrier layer on said TaN layer, said barrier layer being one of a Cr-based barrier layer, a V-based barrier layer, a Nb-based barrier layer and a Ti-based barrier layer; and
    depositing Cu in said opening such that said Cu contacts said barrier layer and substantially fills said opening, thereby forming a conductive structure in said opening.

12. The method as in claim 11, wherein said bottom surface includes a lowermost portion and a raised portion at a higher location than said lowermost portion, said lowermost portion comprising a subjacent layer of semiconductor material with dopant impurities therein and said raised portion comprising at least part of a subjacent gate structure formed over said subjacent layer.

13. The method as in claim 11, said opening comprises dual damascene opening, said TaN layer is an amorphous layer, and said bottom surface comprises a metal surface.

14. The method as in claim 11, wherein said barrier layer comprises at least one of $CrO_x$, $CrC_y$, $CrSi_xO_y$, CrNx; $VO_x$, $VC_x$, $VSi_xO_y$, VNx; $NbO_x$, $NbC_x$, $NbSi_xO_y$, NbNx; $TiO_x$, $TiC_x$, $TiSi_xO_y$, and TiNx.

15. The method as in claim 11, wherein said opening comprises a trench, said conductive structure comprises a conductive lead, said TaN layer is a polycrystalline layer, and said depositing Cu comprises electrochemical plating.

16. The semiconductor device as in claim 15, wherein said TaN layer is a polycrystalline layer, said Mn-based layer comprises at least one of $MnO_x$, $MnC_x$, $MnN_x$ and $MnSi_3O_y$, and said bottom of said opening is a metal surface.

17. A semiconductor device comprising:
   a conductive structure disposed within a dielectric, said conductive structure comprising:
   a composite barrier layer lining an opening formed in said dielectric, said composite barrier layer including a TaN layer along sidewalls and a bottom of said opening and an Mn-based layer along said TaN layer; and
   Cu substantially filling said opening and bounding said Mn-based layer,
   said TaN layer including a thickness within a range of about 2-100 angstroms.

18. The semiconductor device as in claim 17, wherein said opening comprises a damascene opening, said bottom surface comprises a metal surface and said TaN layer is formed using atomic layer deposition (ALD).

19. The semiconductor device as in claim 17, wherein said TaN layer is an amorphous layer and said bottom comprises a first portion comprising a subjacent layer of semiconductor material with dopant impurities therein and a second portion comprising a contact structure.

20. The semiconductor device as in claim 17, wherein said opening is a dual damascene opening and said bottom includes a lower bottom portion comprising a subjacent layer of semiconductor material with dopant impurities therein, and a raised bottom portion comprising a gate structure formed over said subjacent layer.

* * * * *